US010819334B2

(12) United States Patent
Hu et al.

(10) Patent No.: US 10,819,334 B2
(45) Date of Patent: Oct. 27, 2020

(54) RESET ISOLATION FOR AN EMBEDDED SAFETY ISLAND IN A SYSTEM ON A CHIP

(71) Applicant: TEXAS INSTRUMENTS INCORPORATED, Dallas, TX (US)

(72) Inventors: Chunhua Hu, Plano, TX (US); Venkateswar Reddy Kowkutla, Allen, TX (US); Charles Fuoco, Allen, TX (US)

(73) Assignee: Texas Instruments Incorporated, Dallas, TX (US)

(*) Notice: Subject to any disclaimer, the term of this patent is extended or adjusted under 35 U.S.C. 154(b) by 43 days.

(21) Appl. No.: 16/299,544

(22) Filed: Mar. 12, 2019

(65) Prior Publication Data

US 2019/0212794 A1 Jul. 11, 2019

Related U.S. Application Data

(62) Division of application No. 15/395,156, filed on Dec. 30, 2016, now Pat. No. 10,228,736.

(51) Int. Cl.
*H03K 17/22* (2006.01)

(52) U.S. Cl.
CPC .................... *H03K 17/22* (2013.01)

(58) Field of Classification Search
CPC ...................................................... H03K 17/22
See application file for complete search history.

(56) References Cited

U.S. PATENT DOCUMENTS

| 7,639,052 B2* | 12/2009 | Xiao | G06F 1/24 327/143 |
| 8,058,910 B1* | 11/2011 | Wright | H03L 5/02 327/143 |
| 9,329,210 B1* | 5/2016 | Gupta | G01R 19/1659 |
| 9,473,114 B1* | 10/2016 | Sandhu | H03K 17/223 |
| 2013/0238916 A1 | 9/2013 | Dohm et al. | |
| 2016/0357696 A1 | 12/2016 | Klinglesmith et al. | |

* cited by examiner

*Primary Examiner* — Joseph R Kudirka

(74) *Attorney, Agent, or Firm* — Brian D. Graham; Charles A. Brill; Frank D. Cimino

(57) ABSTRACT

Disclosed embodiments include an electronic system with a power on reset (POR) circuit. The POR circuit includes first voltage detection circuitry to perform a first detection on a supply voltage and to output a first control signal in response to the first detection, second voltage detection circuitry to perform a second detection on the supply voltage and to output a second control signal in response to the second detection, and third voltage detection circuitry to perform a third detection on the supply voltage and to output at least one third control signal in response to the third detection. The POR circuit further has sequencing circuitry with a first input to receive the at least one third control signal and to output a reset signal in response to the at least one third control signal.

14 Claims, 3 Drawing Sheets

RESET ISOLATION FOR AN EMBEDDED SAFETY ISLAND IN A SYSTEM ON A CHIP

CROSS-REFERENCE TO RELATED APPLICATION

This application is a divisional of U.S. patent application Ser. No. 15/395,156 filed on Dec. 30, 2016, which is incorporated herein by reference.

TECHNICAL FIELD

The technical field of this invention is reset signal generation.

BACKGROUND

A functional safety system often requires implementing voltage detectors and supervisory functions for a complex System on a Chip (SoC) in a larger system. Implementing those functions outside of the SoC not only increases the overall system cost, it also lacks the critical features to achieve high level functional safety standard specified by ISO 2626 and IEC 61508.

SUMMARY

In order to design a complex SoC to achieve out of context functional safety features, embedded circuitry is required to generate an internal system reset with built in redundancy. Furthermore, the SoC also needs to comprehend the impact of external reset signals to make sure the device can enter a safe state when a fault occurs.

A fully integrated method is shown for generating a power on Reset on an SoC. Continuous voltage monitoring with integrated supervisory functions and reset sequencing is implemented, with redundant, multi stage voltage monitoring.

In order to optimize the system cost of implementing functional safety, a safety island is integrated inside a System on Chip (SoC) which contains a safety processor and safety related peripherals. During run time, the non-safety island portion of the SoC may go through reset, while the safety island is required to continue running safety functions. If the safety island has pending requests to the rest of the SoC when the reset happens, those pending transactions may be lost, leading to a safety island hang. This invention provides a hardware mechanism to prevent the safety island getting into hang condition in the above scenario.

BRIEF DESCRIPTION OF THE DRAWINGS

These and other aspects of this invention are illustrated in the drawings, in which.

DETAILED DESCRIPTION

Figure 1:
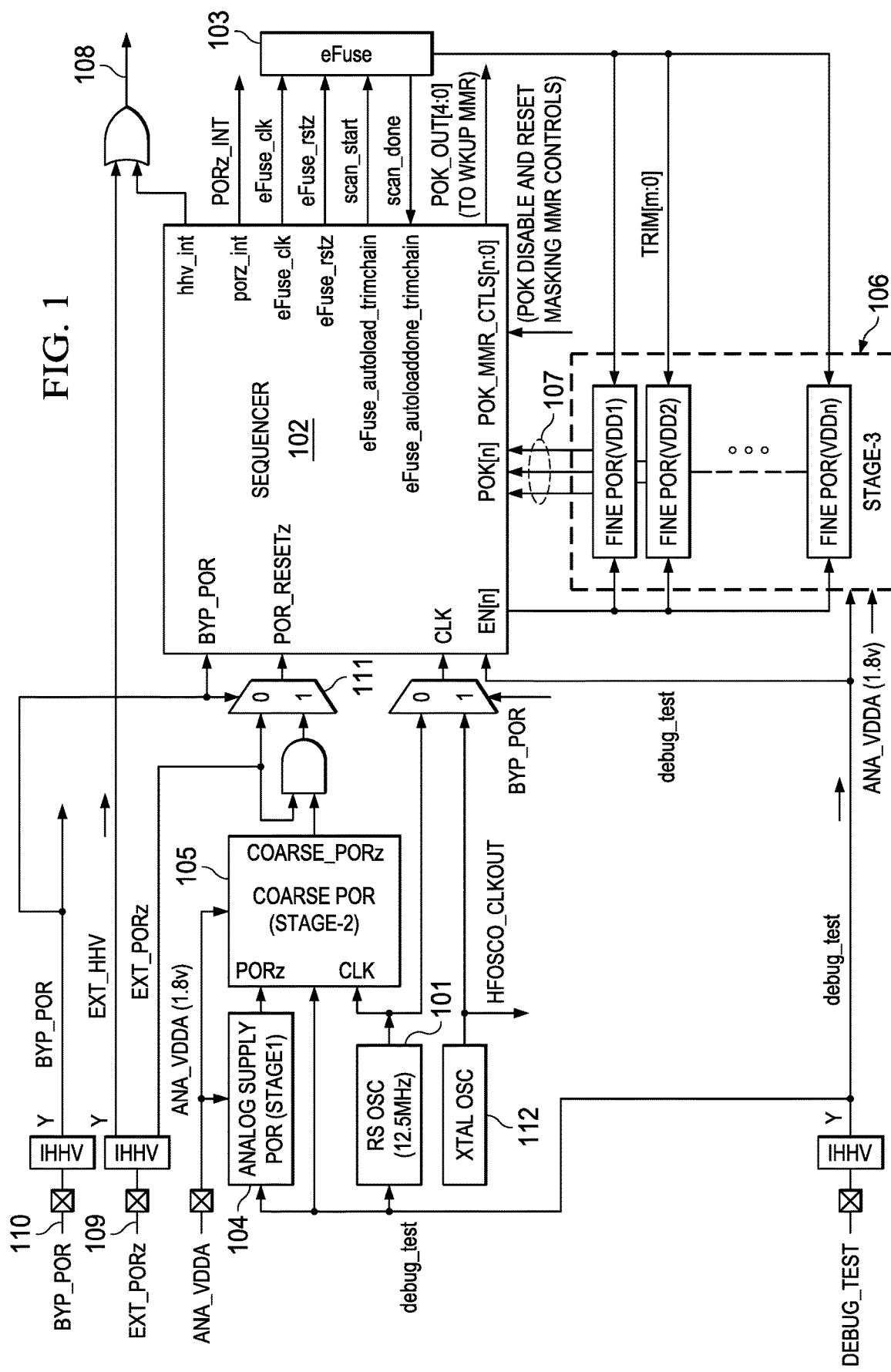
FIG. 1 shows a high level diagram of the reset circuit.

A fully integrated power on reset generation circuitry which can provide continuous voltage monitoring and reset sequencing is shown in FIG. 1. It incorporates control features such as redundancy and diagnostic capabilities which are critical to implement the functional safety feature.

The apparatus includes internal oscillators, a plurality of voltage detection stages and a power on reset (PoR) sequencer.

The internal RC oscillator 101 and crystal oscillator 112 are used to generate the clocks required by the power on reset (PoR) sequencer 102 and efuse module 103. The outputs of voltage monitors 104, 105 and 106 are passed through deglitching circuits to filter out false signals such as glitches and noise from the analog sensors.

The first stage voltage detection circuit 104 is an analog power supply level detector—this is to ensure that the voltage has reached a threshold level at which analog circuits can safely and reliably operate. The second stage voltage detection circuit 105 is a coarse level detector on analog voltage rails and some critical digital voltage rails, which are required for fine tuning analog sensors for process and temperature variations. The third stage voltage detection circuit 106 is a plurality of more accurate level detectors, which ensures that all voltage rails are operating within specified limits. The circuits implemented in the first and second stages do not require any trim values to fine tune the analog circuits for process and temperature variation compensations. The first stage voltage detection circuit 104 controls the reset to the second stage voltage detection circuit 105, and second stage controls the reset to the third stage voltage detection circuit 106. Final master reset signal 108 to the SoC will be a combined version of resets from all 3 stages. This ensures that the device will always receive a reset even if one of the stages is defective therefore providing the required redundancy needed for safety critical applications.

Once the voltage levels are valid, the second stage voltage detection circuit 105 releases reset to only a small portion of the device which enables the device to initiate the efuse scanning. The efuse block 103 contain analog trim values for the voltage detection circuits implemented in the third stage voltage detection circuit 106 for accurate voltage level monitoring. The third stage holds the reset to the designated voltage domains until it detects proper voltage levels on the rails.

After the efuse scanning in efuse block 103 is complete, the power on reset (PoR) sequencer 102 applies the trim values read out from the efuse block 103 to the analog circuits for the voltage monitors in the third stage voltage detection circuit 106. The sequencer then enables the voltage monitors for accurate detection of voltage levels on the rails. The sequencer then waits for a power OK (POK) signal 107 response from each individual detector circuit. When all the voltage monitors indicate power OK on the rails, power on reset sequencer 102 waits for all IOs and clock oscillators in the device to stabilize and then de-asserts the reset signal 108 to the designated voltage domain.

Provision is made for external reset signals 109 and 110 that will override the internally generated resets when selected by selector 111.

All reset signals are properly level shifted to the destination voltage level with appropriate pull-up or pull-down functions. This is to ensure that if the source voltage dies, the reset signal is still at an appropriate level to put the destination voltage domain in the reset state.

Figure 2:
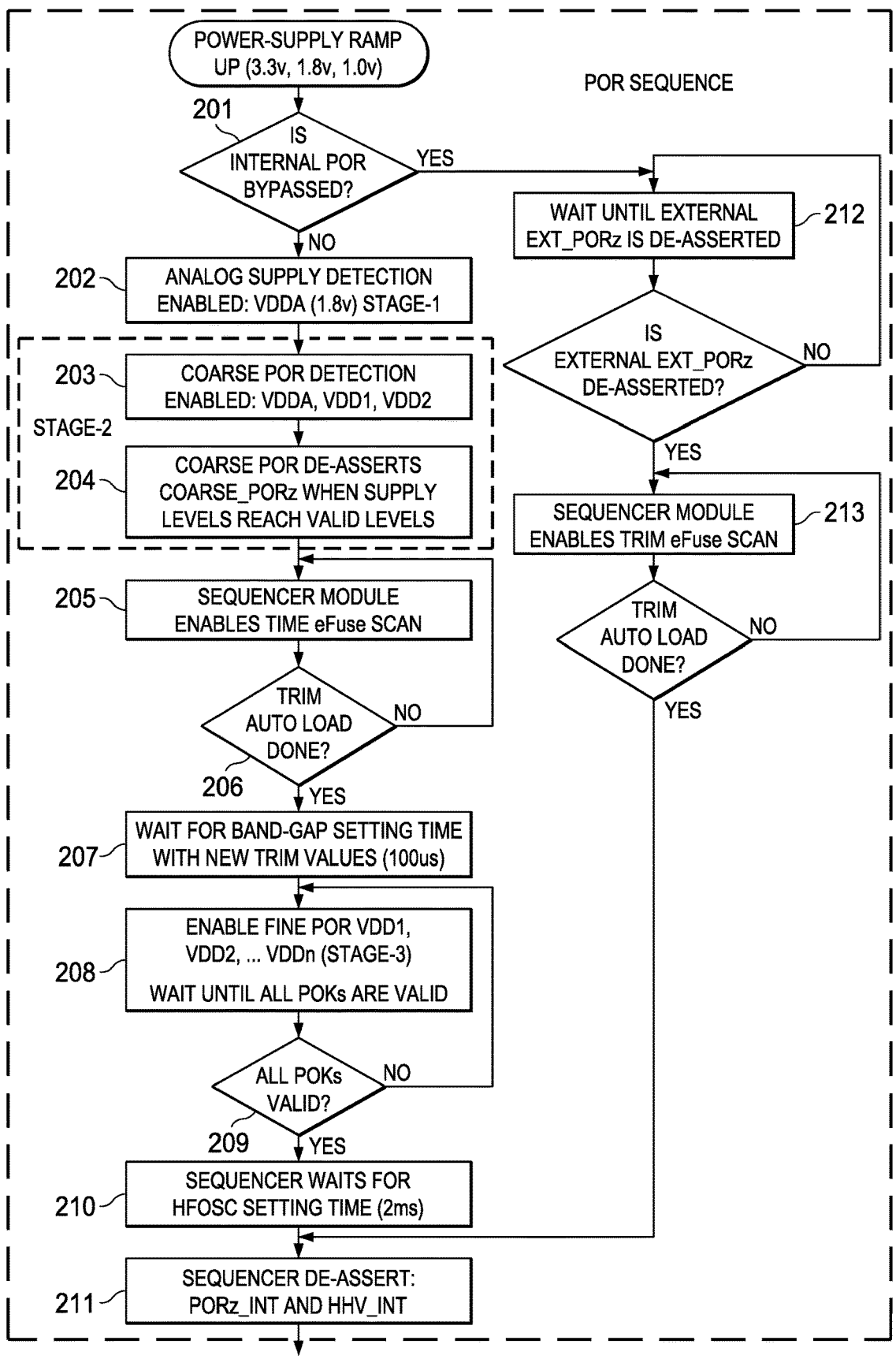
FIG. 2 is a flow chart of the reset function.

FIG. 2 shows the steps involved in the reset generation. Block 201 determines if the external PoR is asserted. If not, analog power supply detection is enabled in block 202, followed by coarse PoR detection in block 203. When power supply voltage levels reach valid levels, coarse PoR is deasserted in block 204. The sequencer module 102 now enables the trim efuse scan in block 205. When completion of the scan is determined in block 206, a settling time is introduced in block 207. After the settling time, the fine corrected power on reset signals are enabled in block 208. When all POK (Power OK) signals are valid as determined in block 209, an oscillator settling time is introduced in block 210, followed by the deassertion of the PoR signals.

If an external power on reset signal is detected in block 201, block 212 introduces a wait until the external power on reset signal is deasserted. Once that is detected, the trim effuse scan is enabled in block 213. Once trim auto load is completed, flow returns to block 211.

Figure 3:
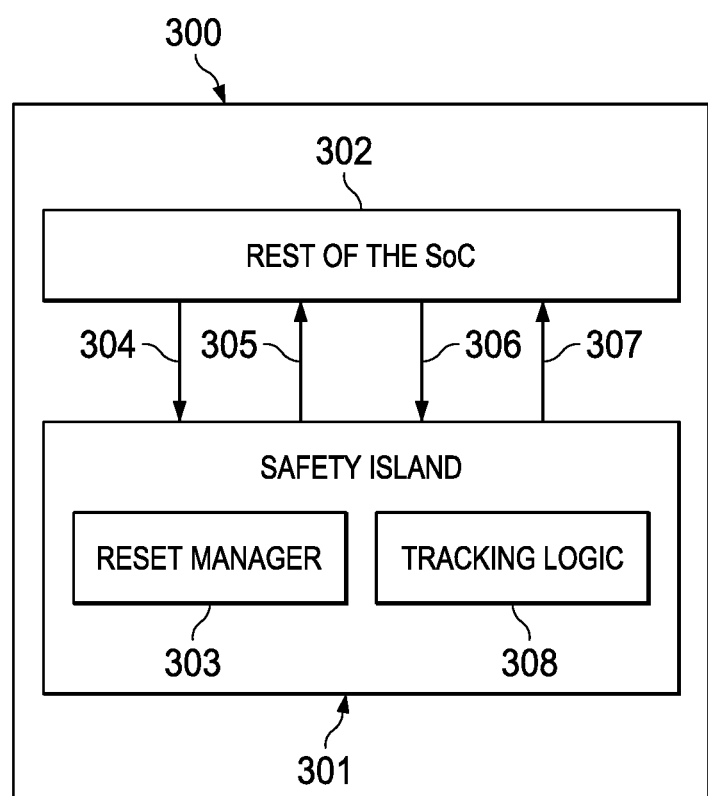
FIG. 3 shows a block diagram of the described parts of the invention.

As shown in FIG. 3, the SoC 300 is partitioned into two parts: safety island 301 and the rest of the SoC 302 including all the logic outside of the safety island. Two dedicated local reset control signals are added, 305 for controlling all the transactions from the safety island 301 to the rest of the SoC 302, and the other reset control signal 304 for all the transactions from the opposite direction. When the rest of the SoC 302 needs to go through reset, it generates a reset request signal, which is routed by 304 to the reset manager 303 inside the safety island 301 as an interrupt. Upon receiving this interrupt, the reset manager 303 will start the reset isolation sequence by asserting the two dedicated local reset control signals 304 and 305.

After these two local reset control signals are asserted, all the new transactions arriving at the boundary between safety island 301 and the rest of the SoC 302 are properly terminated to avoid system hang. Both the safety island 301 and the rest of the SoC 302 continue processing all the transactions internally and send either status or data return back to the initiator. There are bridges 306 and 307 between the safety island 301 and the rest of the SoC 302 which have tracking logic 308 to track the number of pending transactions which have been sent between safety island 301 and the rest of the SoC 302, one bridge for each direction.

When status or data for the previous pending transaction is returned from the safety island 301 to the rest of the system on a chip 302 side or from the rest of system on a chip 302 side to the safety island 301, the tracking logic 308 reduces the number of pending transactions by one for that direction. When the pending transaction count reaches zero, the bridge sends out an ack signal on 304 or 305.

The ack signals from both bridges are AND gated together by reset manager 303 as an indication that there are no more pending transactions between safety island 301 and the rest of system on a chip 302. At this point, the safety island 301 and the rest of the system on a chip 302 are isolated from each other, and the rest of the system on a chip 302 can go through reset without impacting the operation inside safety island 301.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above should not be understood as requiring such separation in all embodiments.

What is claimed is:

1. A power on reset generation circuit comprising:
a first stage voltage detection circuit to determine whether a supply voltage is at least at a first threshold, the first stage voltage detection circuit having a first output to output a first control signal;
a second stage voltage detection circuit to perform coarse detection on the supply voltage, the second stage voltage detection circuit having a second output to output a second control signal and a first input to receive the first control signal;
a sequencing circuit having a second input to receive the second control signal and a third output to output a third control signal at least partially in response to the second control signal;
an eFuse circuit having a third input to receive the third control signal and, in response thereto, output, by a fourth output, a plurality of trim values; and
a third stage voltage detection circuit having a plurality of voltage detectors, each voltage detector receiving a respective one of the plurality of trim values and outputting a respective one of a plurality of power OK (POK) signals when the voltage detector indicates the supply voltage is at a desired voltage level, the third stage voltage detection circuit having a fifth output to output the plurality of POK signals;
wherein the sequencing circuit further includes a fourth input to receive the plurality of POK signals and includes a sixth output to output a master reset signal in response to receiving the plurality of POK signals at the fourth input.

2. The power on reset generation circuit of claim 1, wherein the first stage voltage detection circuit has a fifth input to receive the supply voltage, and wherein the first control signal indicates whether the supply voltage is at least at the first threshold.

3. The power on reset generation circuit of claim 1, comprising a first clock generator to generate a first clock signal and a second clock generator to generate a second clock signal.

4. The power on reset generation circuit of claim 3, wherein the second stage voltage detection circuit includes a fifth input to receive the first clock signal.

5. The power on reset generation circuit of claim 3, comprising a selection circuit to receive the first clock signal and the second clock signal, the selection circuit having a seventh output to output one of the first clock signal or the second clock signal as a selected clock signal in response to a fourth control signal, and wherein the seventh output of the selection circuit is coupled to a fifth input of the sequencing circuit.

6. An electronic system comprising:
a power on reset circuit that includes:
first voltage detection circuitry configured to perform a first detection on a supply voltage and to output a first control signal in response to the first detection;

second voltage detection circuitry configured to perform a second detection on the supply voltage and to output a second control signal in response to the second detection;

third voltage detection circuitry configured to perform a third detection on the supply voltage and to output at least one third control signal in response to the third detection; and sequencing circuitry having a first input to receive the at least one third control signal and to output a reset signal in response to the at least one third control signal.

7. The electronic system of claim 6, wherein the at least one third control signal includes a plurality of third control signals, and wherein the third voltage detection circuitry includes a plurality of voltage detectors, wherein each voltage detector is configured to output a respective one of the plurality of third control signals.

8. The electronic system of claim 7, comprising storage circuitry to store a plurality of trim values.

9. The electronic system of claim 8, wherein the storage circuitry includes an output coupled to the third voltage detection circuitry, wherein each of a plurality of trim signals is supplied via the output of the storage circuitry to a respective one of the voltage detectors of the third voltage detection circuitry, and wherein each trim signal represents one of the trim values.

10. The electronic system of claim 9, wherein the sequencing circuitry is configured to output a fourth control signal to the storage circuitry, wherein the trim value indicated by each of the trim signals is determined in response to the fourth control signal.

11. The electronic system of claim 10, wherein the sequencing circuitry includes a second input to receive the second control signal, and wherein the fourth control signal is based at least partially upon the second control signal.

12. The electronic system of claim 6, wherein the second voltage detection circuitry has an input to receive the first control signal, and wherein the second control signal is based at least partially upon the first control signal.

13. The electronic system of claim 6, wherein the electronic system is arranged on a single integrated circuit die.

14. The electronic system of claim 13, wherein the single integrated circuit die is part of a system on chip (SoC) device.

* * * * *